(12) United States Patent
Cheng et al.

(10) Patent No.: US 9,685,539 B1
(45) Date of Patent: Jun. 20, 2017

(54) NANOWIRE ISOLATION SCHEME TO REDUCE PARASITIC CAPACITANCE

(71) Applicant: International Business Machines Corporation, Armonk, NY (US)

(72) Inventors: Kangguo Cheng, Schenectady, NY (US); Bruce B. Doris, Slingerlands, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/069,468

(22) Filed: Mar. 14, 2016

(51) Int. Cl.
*H01L 27/118* (2006.01)
*H01L 29/66* (2006.01)
*H01L 29/78* (2006.01)
*H01L 29/423* (2006.01)
*H01L 29/06* (2006.01)
(Continued)

(52) U.S. Cl.
CPC .. *H01L 29/66795* (2013.01); *H01L 21/02532* (2013.01); *H01L 21/22* (2013.01); *H01L 21/3065* (2013.01); *H01L 21/76232* (2013.01); *H01L 27/0886* (2013.01);
(Continued)

(58) Field of Classification Search
CPC ............. H01L 29/7378; H01L 29/7848; H01L 31/035254; H01L 31/1812; H01L 31/1816; H01L 31/204; H01L 2924/10271; H01L 27/3223; H01L 29/66545; H01L 29/66606; H01L 29/66871
See application file for complete search history.

(56) References Cited

U.S. PATENT DOCUMENTS 7,892,945 B2 2/2011 Bedell et al.
8,216,902 B2 * 7/2012 Chang .................. B82Y 10/00
257/E21.645
(Continued)

FOREIGN PATENT DOCUMENTS

WO 2015094301 A1 6/2015

OTHER PUBLICATIONS

Disclosed Anonymously, "Method of Forming a Stacked Silicon Nanowire Device," ip.com, IPCOM000211772, Oct. 17, 2011, 5 pages.
(Continued)

*Primary Examiner* — Cuong B Nguyen
(74) *Attorney, Agent, or Firm* — Vazken Alexanian; Ryan, Mason & Lewis, LLP

(57) ABSTRACT

A method for manufacturing a semiconductor device includes forming a doped silicon layer on a bulk substrate, forming an undoped silicon cap layer on the doped silicon layer, forming a stacked configuration of silicon germanium (SiGe) and silicon layers on the undoped silicon cap layer, wherein the stacked configuration comprises a repeating arrangement of a silicon layer stacked on an SiGe layer, forming a plurality of dummy gates spaced apart from each other on the stacked configuration, the doped silicon layer and the undoped silicon cap layer, forming a spacer layer on each of the plurality of dummy gates, and on the doped silicon layer and the undoped silicon cap layer, selectively etching the doped silicon layer with respect to the undoped silicon layer, and filling the area from where the doped s silicon layer was selectively removed with a dielectric layer.

15 Claims, 11 Drawing Sheets

(51) Int. Cl.
*H01L 21/762* (2006.01)
*H01L 21/22* (2006.01)
*H01L 21/02* (2006.01)
*H01L 21/3065* (2006.01)
*H01L 27/088* (2006.01)

(52) U.S. Cl.
CPC ...... *H01L 29/068* (2013.01); *H01L 29/42392* (2013.01); *H01L 29/66545* (2013.01); *H01L 29/785* (2013.01)

(56) References Cited

U.S. PATENT DOCUMENTS

| | | |
|---|---|---|
| 8,389,416 B2 | 3/2013 | Luong |
| 8,466,451 B2 | 6/2013 | Chang et al. |
| 8,936,972 B2 | 1/2015 | Bangsaruntip et al. |
| 8,994,081 B2 | 3/2015 | Leobandung |
| 9,136,343 B2 | 9/2015 | Pillarisetty et al. |
| 2012/0146053 A1 | 6/2012 | Saitoh et al. |
| 2015/0243733 A1 | 8/2015 | Yang et al. |
| 2015/0295084 A1 | 10/2015 | Obradovic et al. |
| 2015/0372119 A1 | 12/2015 | Zhang et al. |

OTHER PUBLICATIONS

Disclosed Anonymously, "Partially Suspended Nanowire with a Tensile Channel Stressor," ip.com, IPCOM000232209, Oct. 25, 2013, 2 pages.

Disclosed Anonymously, "Slab-Type Nanowire FET Structure (SOI & Bulk) to Enlarge Effective Channel Width Without Short-Channel Degradation," ip.com, IPCOM000238286, Aug. 14, 2014, 3 pages.

Disclosed Anonymously, "Fabrication Method for Hybrid Orientation Vertically Stacked III-V and Ge Gate-All-Around CMOS," ip.com, IPCOM000244332, Dec. 2, 2015, 8 pages.

I. Lauer et al., "Si Nanowire CMOS Fabricated with Minimal Deviation from RMG FinFET Technology Showing Record Performance," 2015, pp. T140-T141, Symposium on VLSI Technology Digest of Technical Papers, vol. 10-2.

* cited by examiner

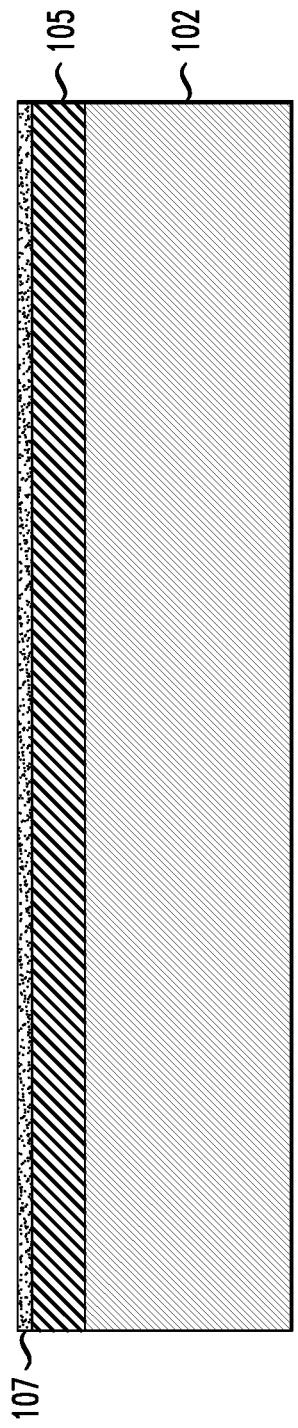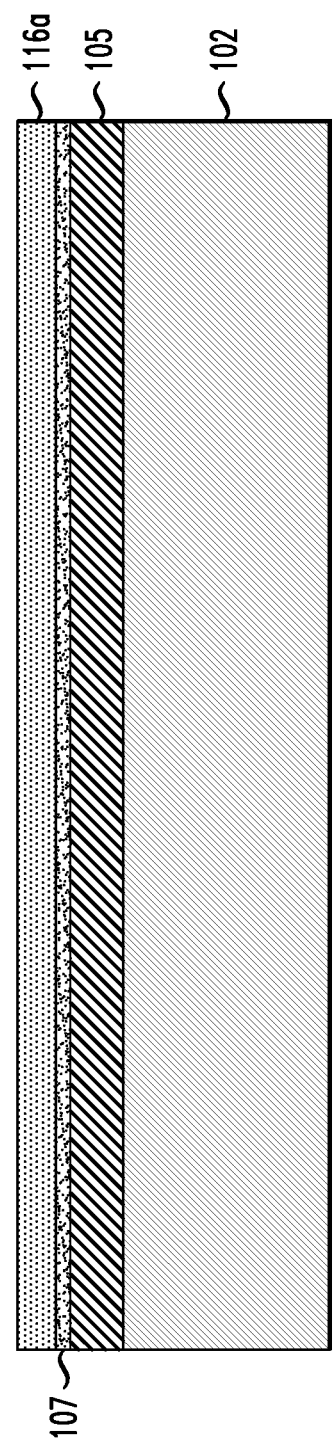

NANOWIRE ISOLATION SCHEME TO REDUCE PARASITIC CAPACITANCE

TECHNICAL FIELD

The field generally relates to semiconductor devices and methods of manufacturing same and, in particular, to a semiconductor device including a dielectric isolation layer under a nanowire to reduce parasitic capacitance between the nanowire and a bulk substrate.

BACKGROUND

A nanowire is a relatively thin wire, for example, with a diameter or width measured in nanometers (nm). Nanowires can have diameters or widths such as, for example, about 4 nm to 10 nm. Nanowires can be a viable device option instead of fin field-effect transistors (FinFETs). For example, a nanowire can be used replace the FinFET device architecture. Nanowires enable a gate to completely wrap around the channel to improve gate control and lower drain-induced barrier lowering (DIBL) and sub-threshold swing. Nanowires can have a smaller perimeter than fins, but also larger external resistance due to an under-spacer component. Complementary metal-oxide semiconductor (CMOS) scaling can be enabled by the use of stacked nanowires, which offer superior electrostatics and higher current density per footprint area than FinFETs.

With respect to nanowire devices, bulk substrates, when compared to silicon-on-insulator (SOI) substrates, offer low cost. However, manufacturing a nanowire device on a bulk substrate may lead to difficulties in controlling device characteristics. For example, when starting with a bulk substrate, parasitic capacitance can occur between the substrate and source/drain and channel regions that are not isolated from the substrate. Parasitic capacitance degrades circuit performance and consumes power.

SUMMARY

According to an exemplary embodiment of the present invention, a method for manufacturing a semiconductor device includes forming a doped semiconductor layer on a bulk substrate, forming an undoped cap layer on the doped semiconductor layer, forming a stacked configuration of silicon germanium (SiGe) and silicon layers on the undoped cap layer, wherein the stacked configuration comprises a repeating arrangement of a silicon layer stacked on an SiGe layer, forming a plurality of dummy gates spaced apart from each other on the stacked configuration, the doped semiconductor layer and the undoped cap layer, forming a spacer layer on each of the plurality of dummy gates, and on the doped semiconductor layer and the undoped cap layer, selectively removing the doped semiconductor layer adjacent the bulk substrate, and filling the area from where the doped semiconductor layer was selectively removed with a dielectric layer.

According to an exemplary embodiment of the present invention, a semiconductor device includes a bulk substrate, a plurality of nanowires formed in a stacked configuration on the bulk substrate, a dielectric layer between the bulk substrate and the stacked configuration, an undoped cap layer on the dielectric layer between the dielectric layer and the stacked configuration, and a plurality of gate structures formed around the plurality of nanowires.

According to an exemplary embodiment of the present invention, a method for manufacturing a semiconductor device includes forming a doped silicon layer on a bulk substrate, forming an undoped silicon cap layer on the doped silicon layer, forming a stacked configuration of silicon germanium (SiGe) and silicon layers on the undoped silicon cap layer, wherein the stacked configuration comprises a repeating arrangement of a silicon layer stacked on an SiGe layer, forming a plurality of dummy gates spaced apart from each other on the stacked configuration, the doped silicon layer and the undoped silicon cap layer, forming a spacer layer on each of the plurality of dummy gates, and on the doped silicon layer and the undoped silicon cap layer, selectively etching the doped silicon layer with respect to the undoped silicon layer, and filling the area from where the doped s silicon layer was selectively removed with a dielectric layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 1 is a cross-sectional view illustrating formation of a doped and undoped silicon layers on a substrate in a method of manufacturing a semiconductor device, according to an exemplary embodiment of the present invention.

FIG. 2 is a cross-sectional view illustrating formation of a silicon germanium (SiGe) layer on the structure in FIG. 1 in a method of manufacturing a semiconductor device, according to an exemplary embodiment of the present invention.

DETAILED DESCRIPTION

Figure 3:
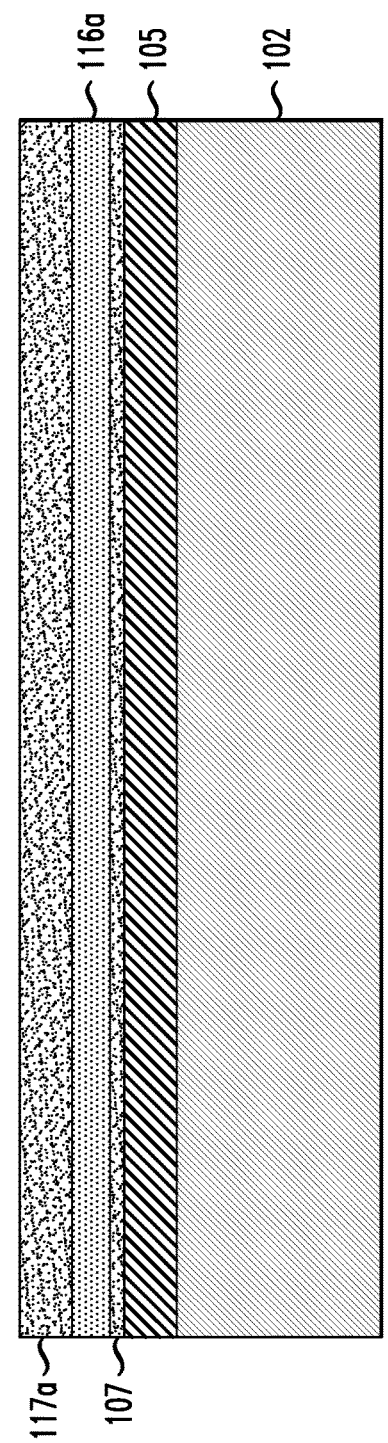
FIG. 3 is a cross-sectional view illustrating formation of a silicon layer on the structure in FIG. 2 in a method of manufacturing a semiconductor device, according to an exemplary embodiment of the present invention.

Exemplary embodiments of the invention will now be discussed in further detail with regard to semiconductor devices and methods of manufacturing same and, in particular, to a semiconductor device including a dielectric isolation layer under a nanowire to reduce parasitic capacitance between the nanowire and a bulk substrate.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), nanowire and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require nanowires, CMOSs, MOSFETs and/or FinFETs. By way of non-limiting example, the semiconductor devices can include, but are not limited to nanowire, CMOS, MOSFET and FinFET devices, and/or semiconductor devices that use nanowire, CMOS, MOSFET and/or FinFET technology.

As used herein, "parallel to a gate extension direction" refers to an extension direction of a gate structure perpendicular to a channel length (e.g., perpendicular to a nanowire extension direction).

As used herein, "perpendicular to a gate extension direction" or "across a channel of a gate structure" refers to a channel length direction of a gate structure (e.g., parallel to a nanowire extension direction). Left and right these cross-sections represents a length of a nanowire and a channel length, and the width or diameter of the nanowire and a gate extension direction are going into the page.

As used herein, "vertical" refers to a direction perpendicular to a substrate in the cross-sectional views.

As used herein, "horizontal" refers to a direction parallel to a substrate in the cross-sectional views.

As used herein, "height" or "thickness" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional views measured from a top surface to a bottom surface of the element.

As used herein, "lateral," "lateral side," "lateral surface" refers to a side surface of an element (e.g., a layer, opening, etc.), including, but not limited to, a left or right side surface in the cross-sectional views.

As used herein, "width" or "length" refers to a size of an element (e.g., a layer, trench, hole, etc.) in the figures measured from a side surface to an opposite surface of the element.

Embodiments of the present invention provide a semiconductor device and method for manufacturing the same, which reduces parasitic capacitance by starting with a bulk wafer and forming a sacrificial material that is removed and back filled with a dielectric so that the source/drain and channel regions are isolated from the substrate. According to an embodiment of the present invention, a dielectric isolation layer is formed under a nanowire stack between the nanowire stack and a bulk substrate to reduce parasitic capacitance. More specifically, in a non-limiting illustrative embodiment, a doped silicon layer is formed on a bulk substrate followed by formation of an undoped silicon layer and an alternating SiGe/Si nanosheet stack. After nanosheet stack patterning and dummy gate formation, the doped silicon layer is removed using a suitable dry etch process, which selectively removes the doped layer. The undoped silicon cap layer protects the SiGe/Si nanosheet stack during etching while the doped layer is removed. Then, a dielectric layer is deposited that can flow under the source/drain and channel regions of the nanowire stack followed by processing, such as replacement metal gate processing, to complete the nanowire device.

The cross-sectional views of FIGS. 1-7 and 9-13 are taken perpendicular to a gate extension direction and parallel to a nanowire extension direction.

FIG. 1 is a cross-sectional view illustrating formation of a doped and undoped silicon layers on a substrate in a method of manufacturing a semiconductor device, according to an exemplary embodiment of the present invention. Referring to FIG. 1, in a non-limiting illustrative embodiment, a doped semiconductor layer 105 is formed on a bulk substrate 102, followed by formation of an undoped semiconductor layer 107. The bulk substrate 102 comprises semiconductor material including, but not limited to, Si, silicon germanium (SiGe) or other like semiconductor. In addition, multiple layers of the semiconductor materials can be used as the semiconductor material of the substrate.

The doped semiconductor layer 105 can include silicon doped with phosphorous (P), Arsenic (As) or other suitable dopant, at a concentration of, for example, about 5E14 to about 6E16 atoms/cm$^2$. Doping can be, for example, n-type or p-type doping, depending on design requirements. For example, the doped semiconductor layer 105 can include N+ doped silicon. The undoped semiconductor layer 107, also referred to herein as a cap layer, can include, for example, silicon. Other semiconductor materials that can be used for the layers 105 and 107 include, but are not necessarily limited to, SiGe, gallium arsenide (GaAs), and indium phosphide (InP).

According to an embodiment of the present invention, the layers 105 and 107 are epitaxially grown. Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from, for example, 550° C. to 900° C. Although higher temperature typically results in faster deposition, the faster deposition may result in crystal defects and film cracking.

A number of different sources may be used for the epitaxial growth of Si and SiGe layers. In some embodiments, a gas source for the deposition of epitaxial semiconductor material includes a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Alternatively, the layers 105 and 107 can be formed by deposition techniques, such as, for example, including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating.

In a non-limiting illustrative embodiment, a height of the layer 105 can be in the range of about 3 nm to about 25 nm, and a height of the layer 107 can be in the range of about 3 nm to about 9 nm.

FIG. 2 is a cross-sectional view illustrating formation of a silicon germanium (SiGe) layer on the structure in FIG. 1 in a method of manufacturing a semiconductor device, according to an exemplary embodiment of the present invention. Referring to FIG. 2, in a non-limiting illustrative embodiment, a first SiGe layer 116a of a SiGe/Si nanosheet stack is formed on the undoped silicon layer 107 by epitaxial growth. In accordance with an embodiment of the present invention, the layer 116a is undoped, and includes, for example, germanium at a 25% concentration, but is not limited thereto. Other concentrations of germanium can also be used. In a non-limiting illustrative embodiment, a height of the layer 116a can be in the range of about 6 nm to about 20 nm. Alternative materials may be used that have the property of being removed selectively compared to the nanowire channel material.

FIG. 3 is a cross-sectional view illustrating formation of a silicon layer on the structure in FIG. 2 in a method of manufacturing a semiconductor device, according to an exemplary embodiment of the present invention. Referring to FIG. 3, in a non-limiting illustrative embodiment, a first silicon layer 117a of the SiGe/Si nanosheet stack is formed on the SiGe layer 116a by epitaxial growth. In accordance with an embodiment of the present invention, the layer 117a is undoped silicon, and includes the same or a similar composition to layer 107. A height of the layer 117a can be in the range of about 5 nm to about 15 nm. Other materials that can be used for the layer 117a, include, for example, SiGe, InP, and GaAs. According to an embodiment, the layer 107 is thinner (i.e., has a smaller thickness) than the layer 117a.

Figure 4:
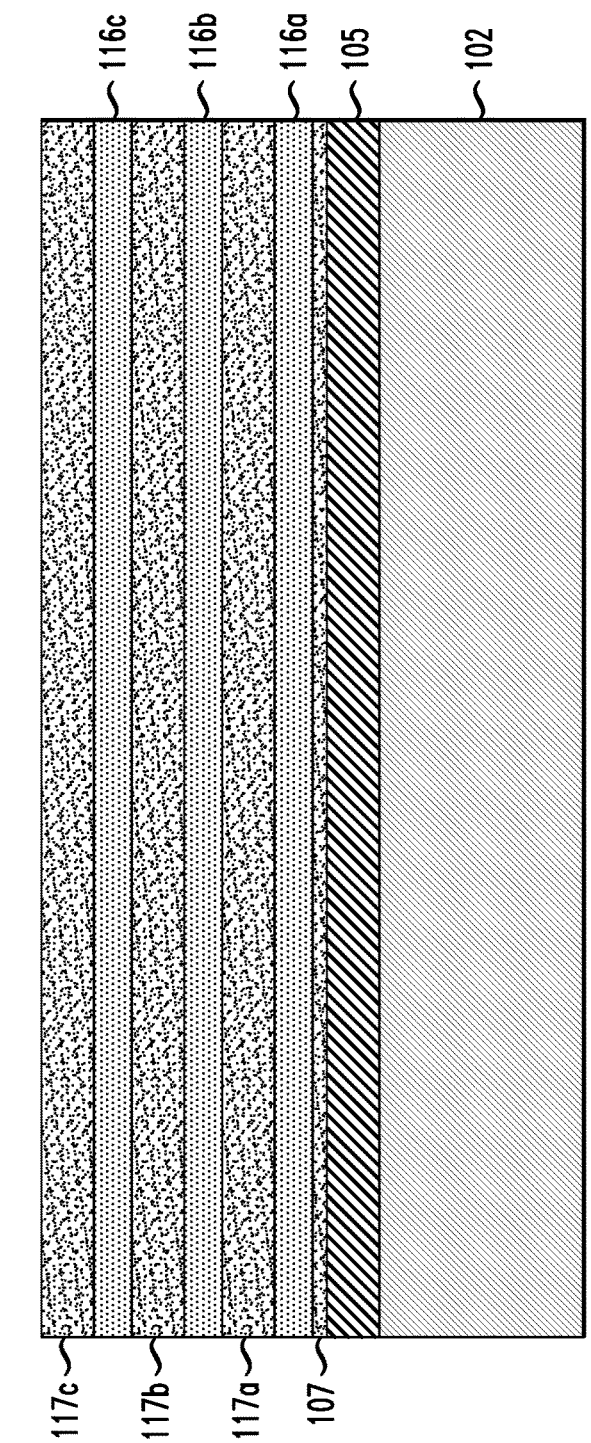
FIG. 4 is a cross-sectional view illustrating formation of additional SiGe and silicon layers in a stacked configuration on the structure in FIG. 3 in a method of manufacturing a semiconductor device, according to an exemplary embodiment of the present invention.

FIG. 4 is a cross-sectional view illustrating formation of additional SiGe and silicon layers in a stacked configuration on the structure in FIG. 3 in a method of manufacturing a semiconductor device, according to an exemplary embodiment of the present invention. Referring to FIG. 4, in a non-limiting illustrative embodiment, remaining SiGe layers 116b and 116c, and remaining silicon layers 117b and 117c of the SiGe/Si nanosheet stack are formed on the silicon layer 117a by epitaxial growth. In accordance with an embodiment of the present invention, the layers 116b and 116c have the same or substantially the same composition and size as the layer 116a, and the layers 117b and 117c have the same or substantially the same composition and size as the layer 117a. The layers 116a-116c and 117a-117c are epitaxially grown in an alternating and stacked configuration, so that a first SiGe layer 116a is followed by a first Si layer 117a on the first SiGe layer, which is followed by a second SiGe layer 116b on the first Si layer 117a, and so on. While three SiGe layers 116a-116c and three Si layers 117a-117c are shown, the embodiments of the present invention are not necessarily limited to the shown number of layers 116, 117, and there may be more or less layers in the same alternating configuration depending on design constraints. The silicon layers 117a-117c are the stacked nanowires of the resulting semiconductor device, and, as described further below, the SiGe layers 116a-116c are removed.

In accordance with an embodiment of the present invention, the epitaxial growth is performed by growing layers, each of which has a height (in the vertical direction in the figures) of between about 5 nm and about 25 nm. The alternating structure may be formed by in-situ epitaxy of layers 116 and 117 in a rapid thermal chemical vapor deposition (RTCVD) chamber, and by controlling the composition of the mixture of gas, the gas flow, pressure, and temperature in the chamber, as well as the duration of the in-situ epitaxy.

Figure 5:
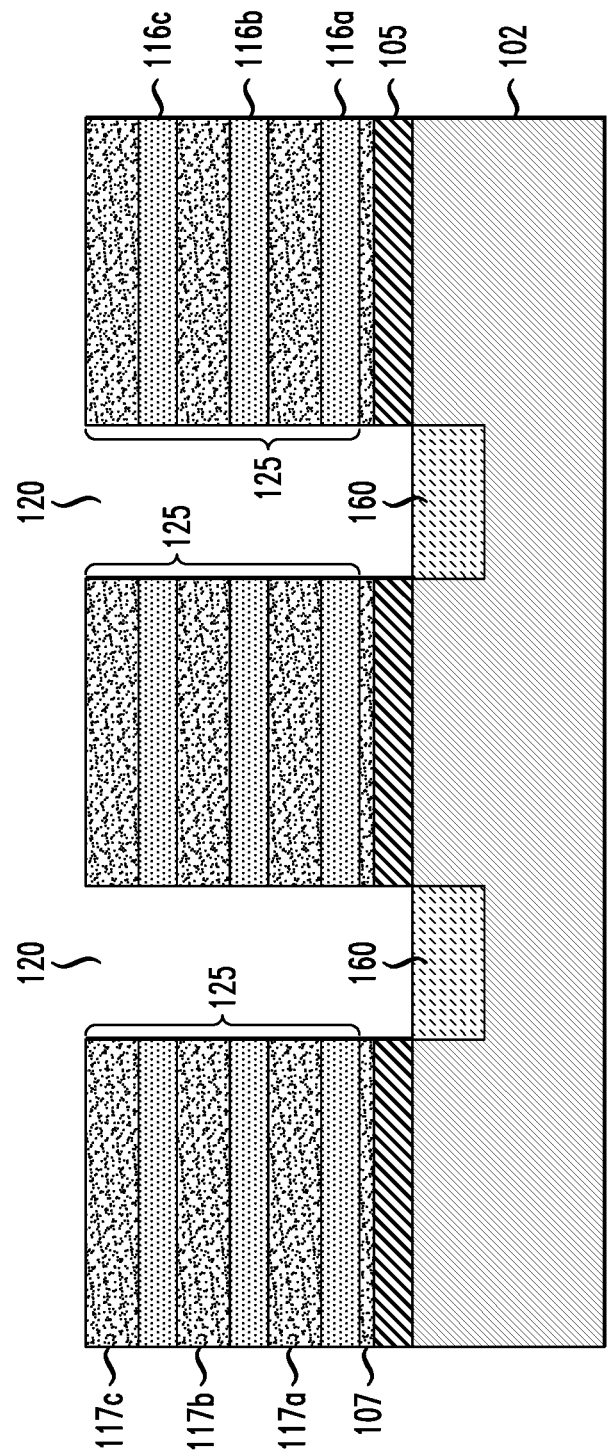
FIG. 5 is a cross-sectional view illustrating patterning of nanosheet stacks and formation of isolation regions in a method of manufacturing a semiconductor device, according to an exemplary embodiment of the present invention.

FIG. 5 is a cross-sectional view illustrating patterning of nanosheet stacks and formation of isolation regions in a method of manufacturing a semiconductor device, according to an exemplary embodiment of the present invention. Patterning is performed by, for example, lithography and dry etching, such as, for example, an isotropic etching process, such as reactive ion etching (RIE). As can be seen in FIG. 5, the patterning creates openings 120 to form a plurality of patterned nanosheet stacks 125 on corresponding layers 105 and 107 spaced apart from each other. The etching is performed using an ME process and a mask including, for example, a nitride, oxide, or an organic resist, covering what is to be a remaining portion of SiGe/Si layers.

FIG. 5 also illustrates formation of isolation regions 160 in a method for manufacturing a semiconductor device, according to an exemplary embodiment of the present invention. Portions of the substrate 102 are etched to form trenches in the substrate 102, in which a dielectric material, including, but not limited to silicon dioxide (SiO$_2$), low-temperature oxide (LTO), high-temperature oxide (HTO), flowable oxide (FOX) or some other dielectric, is deposited to form isolation regions 160, such as, for example, shallow trench isolation (STI) regions. The dielectric material can be deposited using deposition techniques including, but not limited to, CVD, PECVD, RFCVD, PVD, ALD, MLD, MBD, PLD, and/or liquid source LSMCD, sputtering, and/or plating, followed by a planarization process, such as, CMP to remove excess isolation material.

Figure 6:
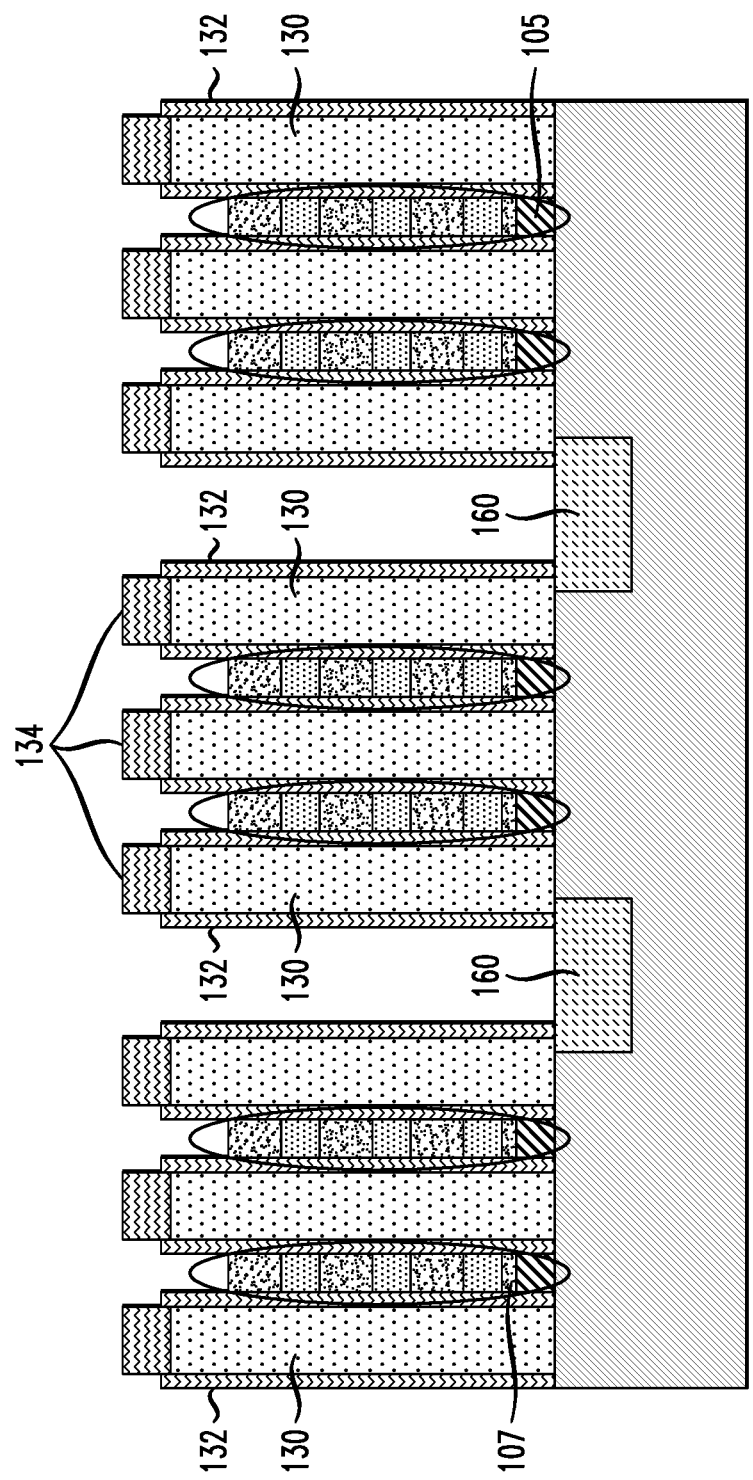
FIG. 6 is a cross-sectional view illustrating dummy gate and spacer formation in a method of manufacturing a semiconductor device, according to an exemplary embodiment of the present invention.

FIG. 6 is a cross-sectional view illustrating dummy gate and spacer formation in a method of manufacturing a semiconductor device, according to an exemplary embodiment of the present invention. Referring to FIG. 6, dummy gate material, including, but not necessarily limited to, polysilicon, amorphous silicon, or a dielectric material such as, for example, oxide or silicon nitride, is deposited on the substrate including the patterned SiGe and silicon stacks 125 using deposition techniques such as, for example, CVD, PECVD, RFCVD, PVD, ALD, MBD, PLD, and/or LSMCD, sputtering, and/or plating, followed by a planarization process, such as, chemical mechanical planarization (CMP), and lithography and etching steps to remove excess dummy gate material, and pattern the deposited layers into dummy gates 130. A dielectric, such as, for example, silicon oxide, silicon nitride, silicon oxynitride, boron nitride, silicon boron nitride, or multilayered stacks thereof, is deposited on sidewalls of the dummy gates 130 and on sidewalls of the patterned nanosheet stacks 125 and underlying layers 107 and 105 to form spacers 132. For purposes of explaining subsequent processing in connection with the removal of layer 105, spacers on the front sidewalls of the patterned nanosheet stacks 125 and underlying layers 107 and 105 in FIG. 6 are not shown. However, it is to be understood that the spacers 132 also cover external sidewalls of the patterned nanosheet stacks 125 and underlying layers 107 and 105 on a front side of the stacks and layers 125, 107 and 105 facing a viewer of FIG. 6, as well as covering sidewalls on an external back side of the stacks and layers 125, 107 and 105 facing into the page of FIG. 6. More specifically, spacers 132 can also be understood to be covering the circled areas in FIG. 6.

Deposition of the spacer material can be performed using deposition techniques including, but not limited to, CVD, PECVD, RFCVD, PVD, ALD, MBD, PLD, and/or LSMCD, sputtering, and/or plating. Portions of the spacer dielectric are anisotropically etched to remove the spacer material from horizontal surfaces with spacers remaining on vertical surface sidewalls of the dummy gates and patterned SiGe/Si nanosheet stacks 125 and underlying layers 107 and 105.

FIG. 6 further illustrates hard mask layers 134 formed on top of the dummy gates 130, which can be formed by the same deposition techniques noted in connection with deposition of the spacer material. The hard mask material can be the same as or similar to the spacer dielectric material, and can be deposited and patterned during the same steps as or in different steps from deposition and patterning of the spacer material.

Figure 7:
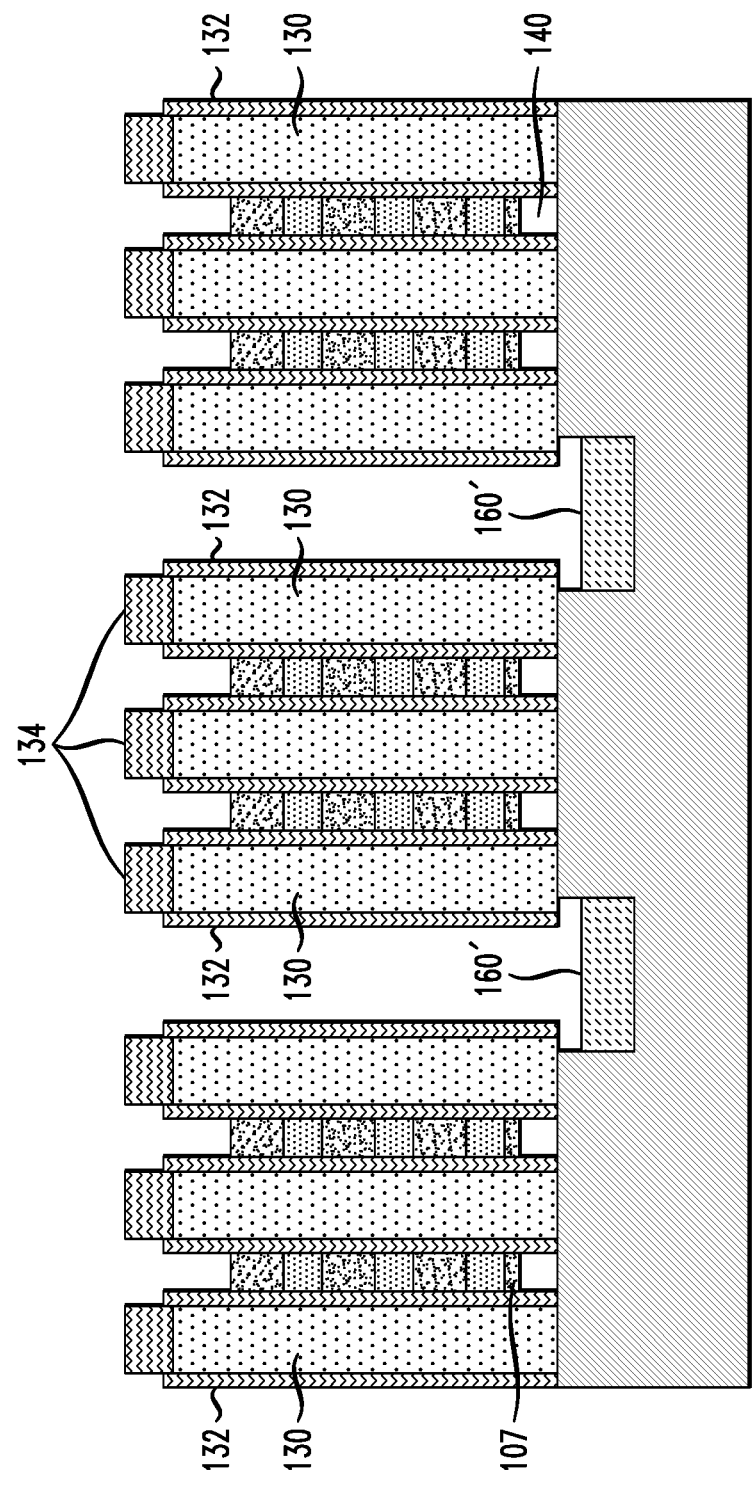
FIG. 7 is a cross-sectional view illustrating recessing of an isolation region and removal of a doped silicon layer adjacent the substrate in a method of manufacturing a semiconductor device, according to an exemplary embodiment of the present invention.

FIG. 7 is a cross-sectional view illustrating recessing of an isolation region and removal of a doped silicon layer adjacent the substrate in a method of manufacturing a semiconductor device, according to an exemplary embodiment of the present invention. Referring to FIGS. 5-7, the isolation regions 160 (e.g., STI regions) are recessed in the vertical direction as illustrated by isolation regions 160' in FIG. 7. The isolation regions 160' are recessed to provide an etchant with access to the doped semiconductor layer 105 from a bottom portion of the doped semiconductor layer. The recessing permits selective removal of the doped semiconductor layer 105 from areas corresponding to source/drain and channel regions. The recessing is performed using, for example, an etching process to vertically etch the isolation region material. The etching process can be, for example, a wet process using, for example, wet dilute hydrofluoric acid, and/or RIE using, for example, CHF$_3$O. According to an embodiment, the recessing is performed using a dry etch chemistry followed by a wet etch chemistry.

Once the STI regions are recessed to expose the doped semiconductor layer 105 from a bottom portion thereof, an etchant, including but not limited to, Cl$_2$/HBr, is introduced to selectively etch the doped semiconductor layer 105 (e.g., doped silicon) with respect to the cap layer 107 (e.g., undoped silicon), so that the layer 107 is not removed and protects the remaining layers of the patterned nanosheet stacks 125 from being removed. As a result, the etchant is not required to be selective with respect to SiGe, since the cap layer 107 protects from a bottom and spacers 132 protect sidewalls of the SiGe layers 116a-116c. According to an embodiment, as an additional level of etch selectivity, the Cl$_2$/HBr etchant may also be able to selectively etch the doped semiconductor layer 105 (e.g., doped silicon) with respect to both the cap layer 107, and the SiGe layers 116. As shown in FIG. 7, the etching results in vacant areas 140 under the patterned nanosheet stacks 125.

Figure 8:
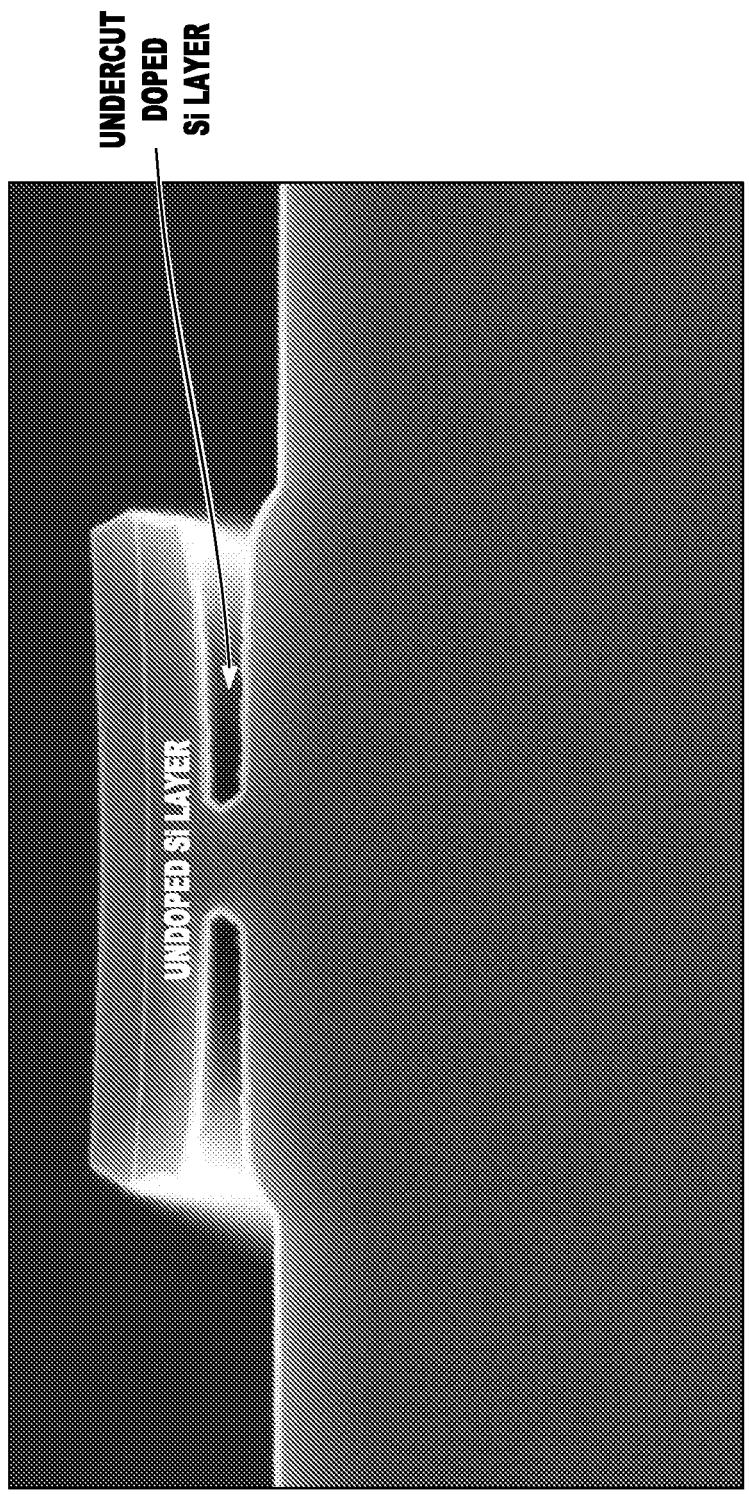
FIG. 8 is a scanning electron microscope (SEM) image illustrating undercutting of a doped silicon layer selective to an undoped silicon layer, according to an exemplary embodiment of the present invention.

FIG. 8 is a scanning electron microscope (SEM) image illustrating undercutting of a doped silicon layer selective to an undoped silicon layer, according to an exemplary embodiment of the present invention. As can be seen in FIG. 8, the doped silicon layer is undercut, while the undoped silicon layer is not etched, or is etched at a much slower rate than the doped silicon layer.

Figure 9:
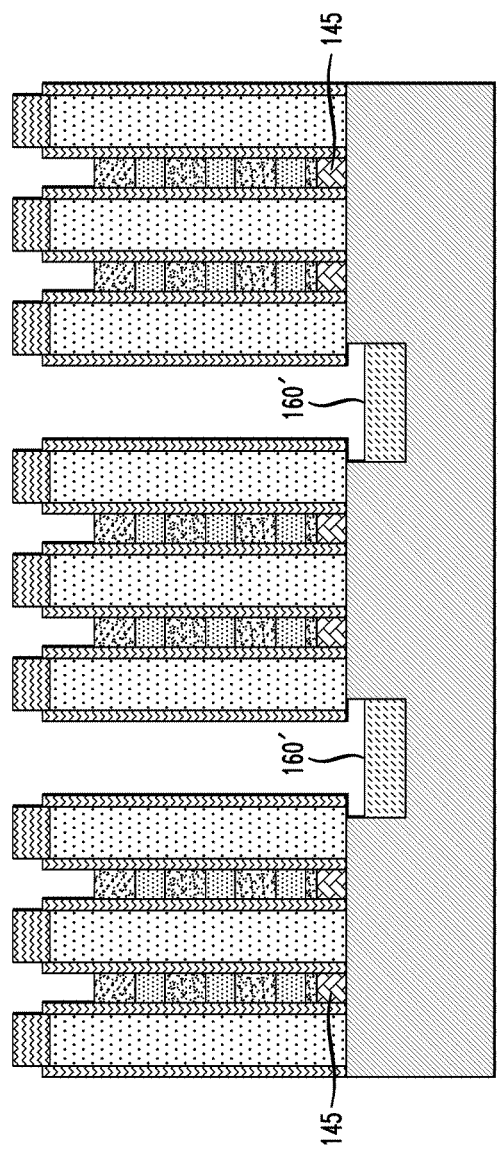
FIG. 9 is a cross-sectional view illustrating deposition of a dielectric on the structure in FIG. 7 in areas adjacent the substrate where the doped silicon layer was removed in a method of manufacturing a semiconductor device, according to an exemplary embodiment of the present invention.

FIG. 9 is a cross-sectional view illustrating deposition of a dielectric on the structure in FIG. 7 in areas adjacent the substrate where the doped silicon layer was removed in a method of manufacturing a semiconductor device, according to an exemplary embodiment of the present invention.

Referring to FIG. 9, a flowable dielectric 145, which can flow under source/drain and channel regions to the vacant areas 140 adjacent the substrate 102 at a bottom portion of the structure, is deposited using deposition techniques including, but not limited to, CVD, PECVD, RFCVD, PVD, ALD, MBD, PLD, and/or LSMCD, sputtering, and/or plating, to back fill the vacant areas 140. The dielectric can include, but is not limited to, FOX, silicon dioxide ($SiO_2$), and silicon nitride. After deposition of the flowable dielectric 145, portions of the substrate 102 adjacent the flowable dielectric 145 can be recessed to receive excess flowable dielectric 145 and ensure that the flowable dielectric 145 resides in the vacant areas 140 without overflowing along sides of the patterned nanosheet stacks 125. The recessing can be performed using a dry reactive ion etch chemistry comprising, for example, $CF_4/O_2$, $CF_4/CHF_3/Ar$, $C_2F_6$, $C_3F_8$, $C_4F_8/CO$, $C_5F_8$, $CH_2F_2$ or hydrofluoric acid.

Figure 10:
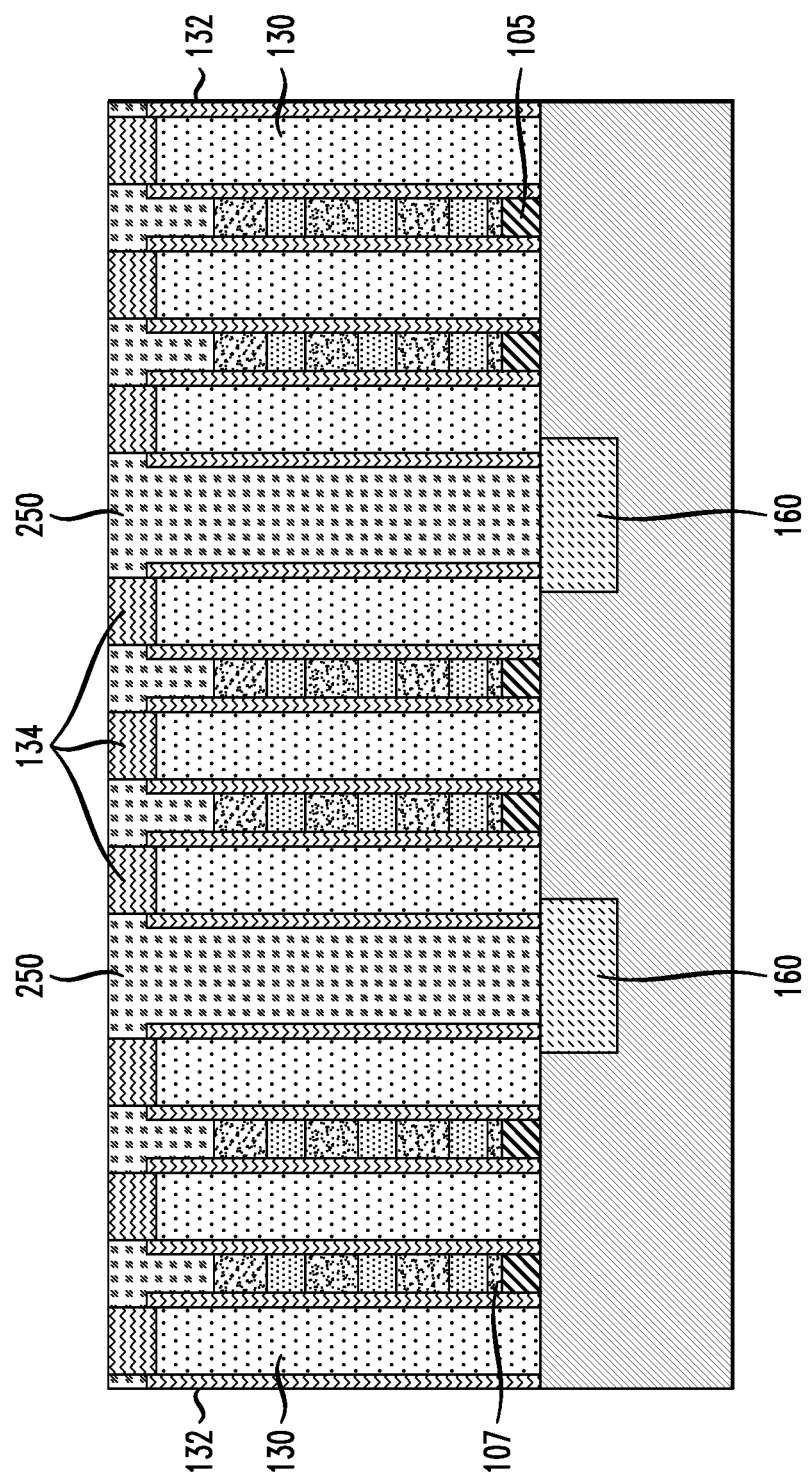
FIG. 10 is a cross-sectional view illustrating deposition of a dielectric and planarization on the structure in FIG. 6 in a method of manufacturing a semiconductor device, according to an exemplary embodiment of the present invention.

FIG. 10 is a cross-sectional view illustrating deposition of a dielectric and planarization on the structure in FIG. 6 in a method of manufacturing a semiconductor device, according to an exemplary embodiment of the present invention. Following processing to result in the structure of FIG. 6, as an alternative to following a process flow to steps described in connection with FIG. 7, as shown in FIG. 10, a dielectric 250, such as for example, silicon dioxide ($SiO_2$), silicon oxynitride (SiON) or amorphous carbon, is deposited on the structure of FIG. 6 using deposition techniques including, but not limited to, CVD, PECVD, RFCVD, PVD, ALD, MBD, PLD, and/or LSMCD, sputtering, and/or plating, followed by a planarization process, such as CMP. As can be seen, the dielectric 250 fills in portions of the structure on the substrate 102, patterned nanosheet stacks 125 and spacers 132, and adjacent the dummy gates 130, spacers 132 and hard masks 134.

Figure 11:
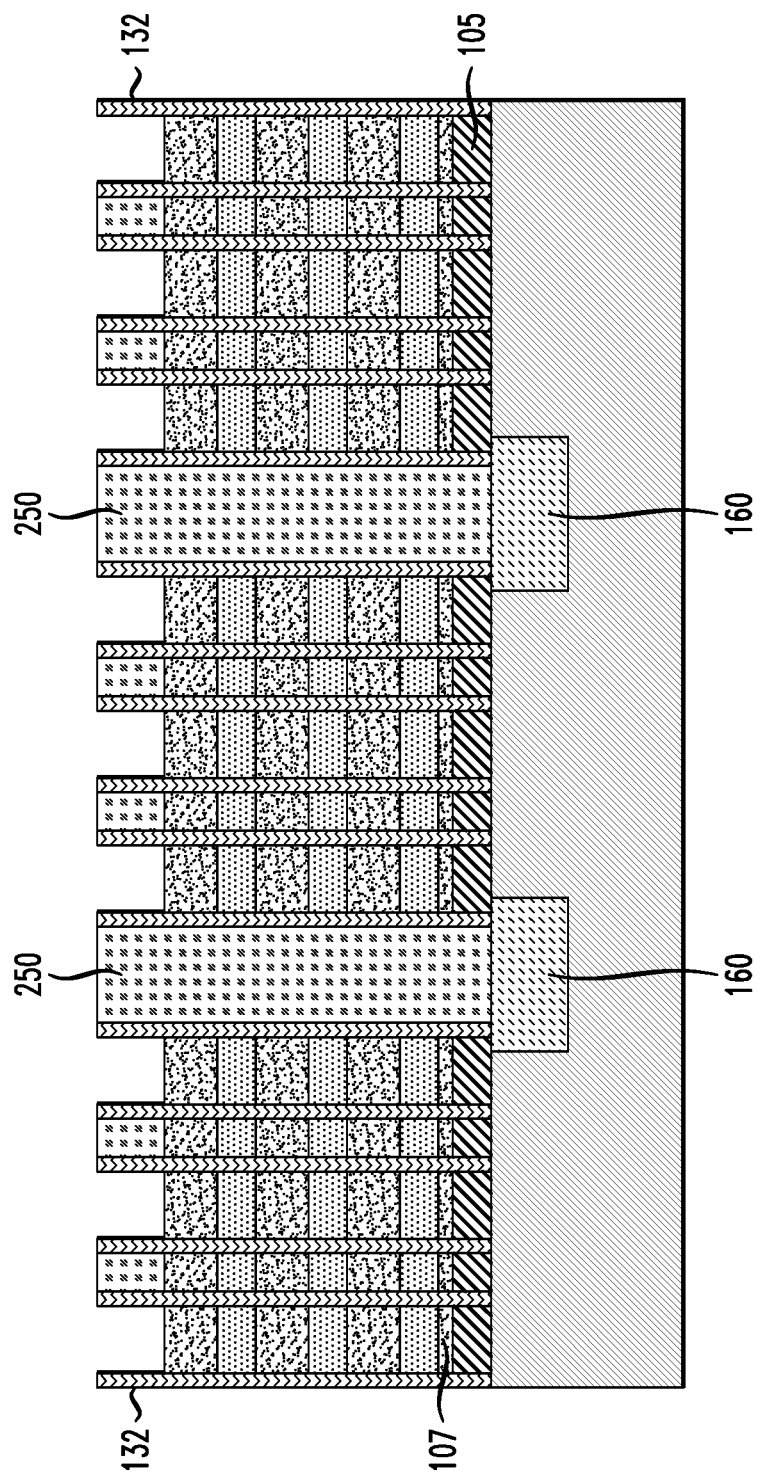
FIG. 11 is a cross-sectional view illustrating removal of mask and gate structures from the structure in FIG. 10 in a method of manufacturing a semiconductor device, according to an exemplary embodiment of the present invention.

FIG. 11 is a cross-sectional view illustrating removal of mask and gate structures from the structure in FIG. 10 in a method of manufacturing a semiconductor device, according to an exemplary embodiment of the present invention. Referring to FIG. 11, the masks 134 and dummy gates 130 are removed using, for example, an etching process including, for example, $HBr/Cl_2/O_2$, $HBr/O_2$, $BCl_3/Cl_2$, $SF_6$.

Figure 12:
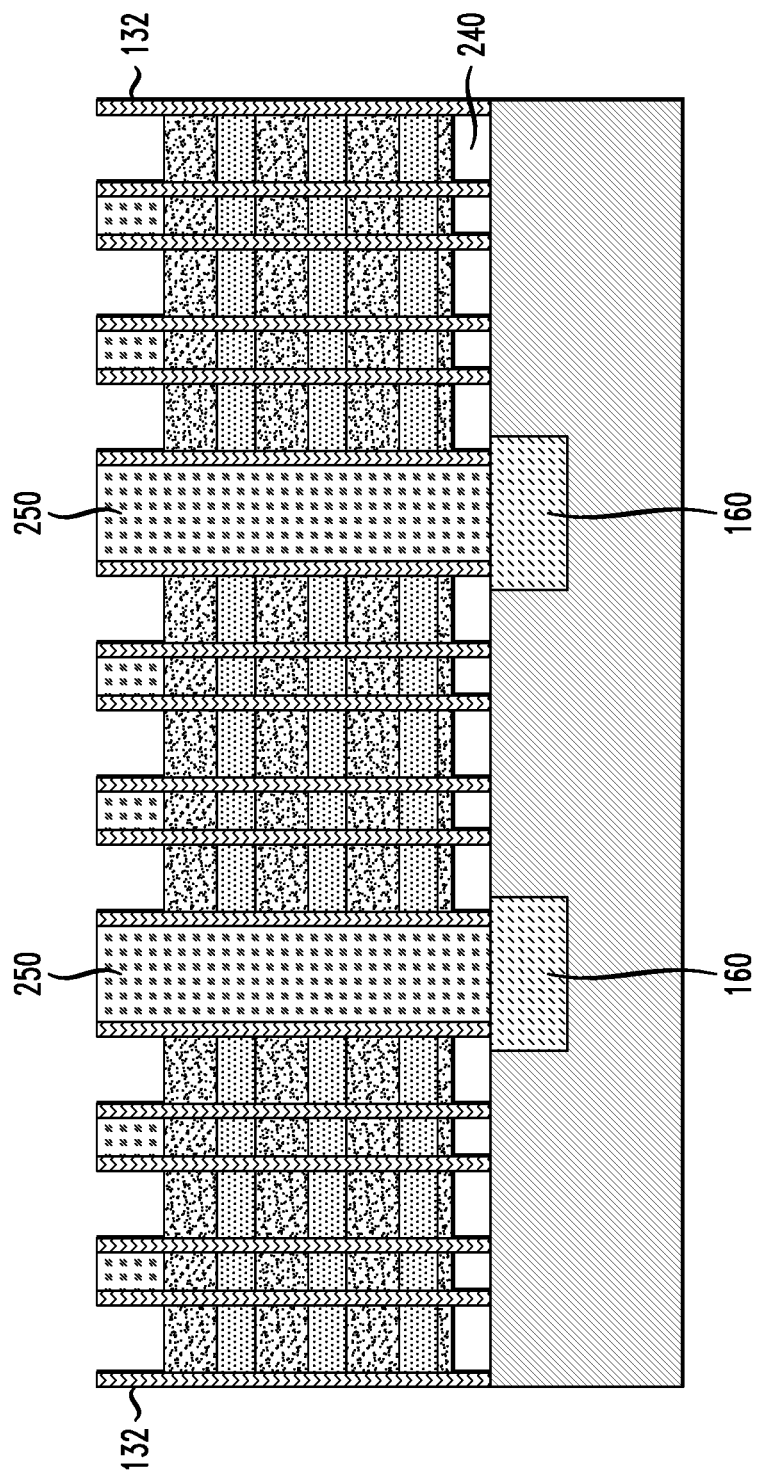
FIG. 12 is a cross-sectional view illustrating removal of a doped silicon layer adjacent the substrate from the structure in FIG. 11 in a method of manufacturing a semiconductor device, according to an exemplary embodiment of the present invention.

FIG. 12 is a cross-sectional view illustrating removal of a doped silicon layer adjacent the substrate from the structure in FIG. 11 in a method of manufacturing a semiconductor device, according to an exemplary embodiment of the present invention. The removal of the masks 134 and dummy gates 130 provides an etchant with access to the doped semiconductor layer 105 through gate holes formed by the removal of the masks 134 and dummy gates 130, so as to permit selective removal of the doped semiconductor layer from areas corresponding to source/drain and channel regions. The gate holes provide the etchant with access to the doped semiconductor layer 105 where the dummy gates 130 were formed, as well as the areas between where the dummy gates 130 were formed. Unlike the embodiment described in connection with FIG. 7, due to the formation of the gate holes, the STI regions do not need to be recessed to provide the etchant with access to the doped semiconductor layer 105. However, in an alternative approach, recessing of the isolation regions 160 can be performed before removal of the doped semiconductor layer 105 even in the case of the embodiment described in connection with FIG. 12, where the doped semiconductor layer 105 is removed through the gate holes.

Once the mask regions 134 and dummy gates 130 are removed to expose the doped semiconductor layers 105, an etchant, including but not limited to, $Cl_2/HBr$, is introduced to selectively etch the doped semiconductor layer 105 (e.g., doped silicon) with respect to the cap layer 107 (e.g., undoped silicon), so that the layer 107 is not removed. The cap layers 107 protect the remaining layers of the nanosheet stacks 125 from being removed. As shown in FIG. 12, the etching results in vacant areas 240 under the patterned nanosheet stacks 125.

According to an embodiment, if the doped semiconductor layer 105 is not etched during formation of the nanowire stacks as described in connection with FIG. 5 (i.e., left continuous during the nanowire stack etching), spacers can be formed on the Si/SiGe stacks 125 stopping on the doped semiconductor layer 105. Then, an etch that is selective to doped silicon, like with $Cl_2/HBr$ as noted above, is used to remove the doped semiconductor layer 105, leaving the Si/SiGe stacks 125 and cap layers 107 in place.

Figure 13:
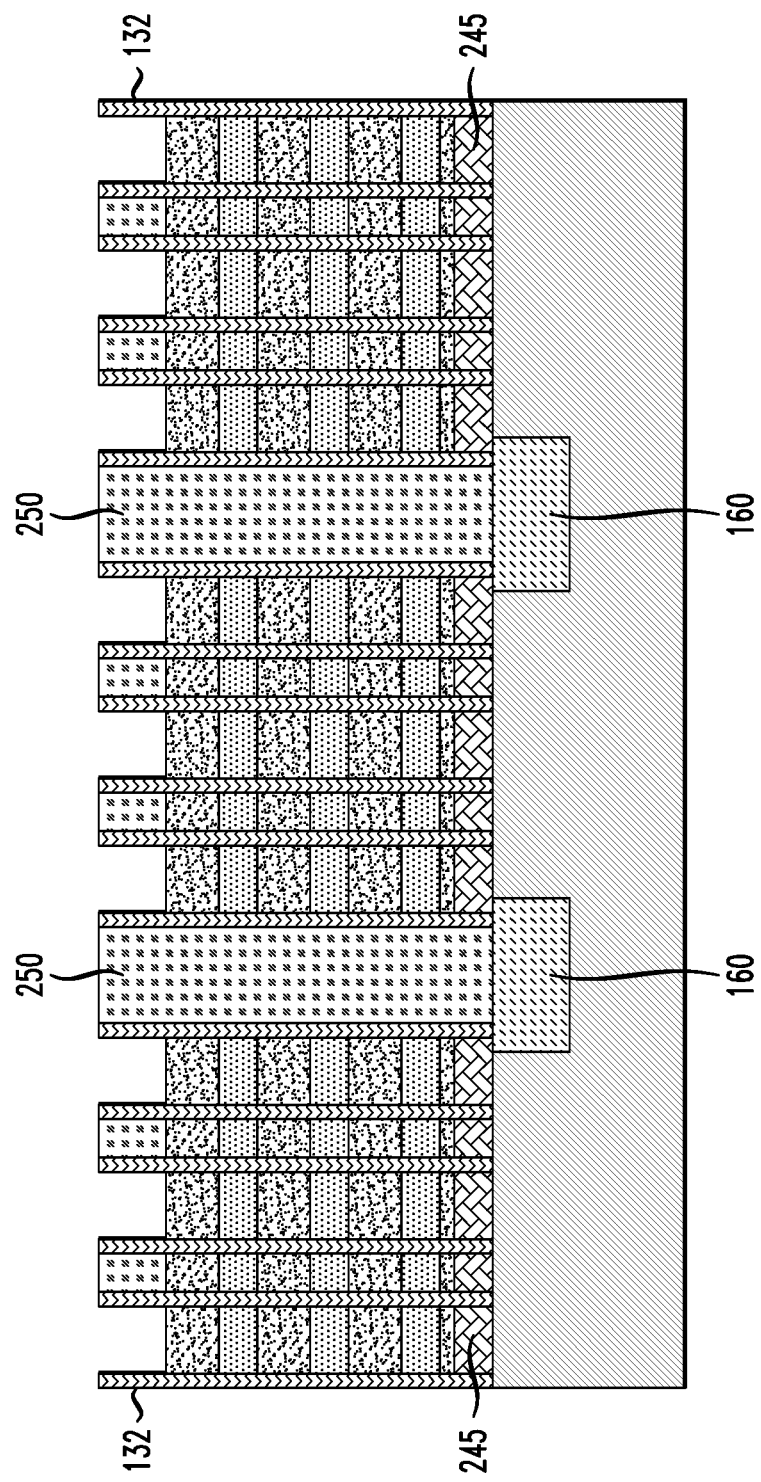
FIG. 13 is a cross-sectional view illustrating deposition of a dielectric on the structure in FIG. 12 in areas adjacent the substrate where the doped silicon layer was removed in a method of manufacturing a semiconductor device, according to an exemplary embodiment of the present invention.

FIG. 13 is a cross-sectional view illustrating deposition of a dielectric on the structure in FIG. 12 in areas adjacent the substrate where the doped silicon layer was removed in a method of manufacturing a semiconductor device, according to an exemplary embodiment of the present invention. Referring to FIG. 13, a flowable dielectric 245, which can flow to the vacant areas 240 adjacent the substrate 102 at a bottom portion of the structure, is deposited using deposition techniques including, but not limited to, CVD, PECVD, RFCVD, PVD, ALD, MBD, PLD, and/or LSMCD, sputtering, and/or plating, to back fill the vacant areas 240. The dielectric can include, but is not limited to, FOX, silicon dioxide ($SiO_2$), SiON, or amorphous carbon, and can be the same material as dielectric 250. As described in connection with the flowable dielectric 145 in FIG. 9, after deposition of the flowable dielectric 245, portions of the substrate 102 adjacent the flowable dielectric 245 can be recessed to ensure that the flowable dielectric 245 resides in the vacant areas 240 and not overflowing along sides of the patterned nanosheet stacks 125.

Following deposition of the flowable dielectric 145, 245 described in connection with FIGS. 9 and 13, the gate structures can be formed by a replacement metal gate (RMG) process. With respect to the embodiment in FIG. 9, further processing similar to that described in connection with FIGS. 10 and 11 is performed to deposit a dielectric and remove dummy gate and hard mask layers.

In order to form the nanowires, the SiGe layers 116a-116c of the patterned nanosheet stacks 125 are selectively removed with respect to the silicon layers 116a-116c. In accordance with an embodiment of the present invention, the removal of the SiGe layers 116a-116c is performed by etching, such as a wet etch, using, for example, a mixture of hydrogen peroxide, hydrofluoric acid and acetic acid, or using an isotropic dry etch with $CF_4$ gas at high pressure in a plasma system. As noted above, the silicon layers 116a-116c are the nanowires of the resulting device. After selective removal of the SiGe layers 116a-116c from the SiGe/Si stacks 125, a dielectric layer can be formed and patterned on the silicon layers 117a-117c prior to deposition of gate metals and gate dielectrics in the RMG process.

In the RMG process, the removed dummy gate structures are replaced with metal gates including, for example, low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. The metal gates may be formed using, for example, deposition techniques including, but not limited to, CVD, PECVD, RFCVD, PVD, ALD, MBD, PLD, and/or LSMCD, sputtering, and/or plating. The replacement gate structure can also include a dielectric deposited prior to the metal gate, including, but not limited to, a high-K dielectric such as, for example, hafnium oxide ($HfO_2$).

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a doped semiconductor layer on a bulk substrate;
   forming an undoped cap layer on the doped semiconductor layer;
   forming a stacked configuration of silicon germanium (SiGe) and silicon layers on the undoped cap layer, wherein the stacked configuration comprises a repeating arrangement of a silicon layer stacked on an SiGe layer;
   forming a plurality of dummy gates spaced apart from each other on the stacked configuration, the doped semiconductor layer and the undoped cap layer;
   forming a spacer layer on each of the plurality of dummy gates, and on the doped semiconductor layer and the undoped cap layer;
   selectively removing the doped semiconductor layer adjacent the bulk substrate; and
   filling the area from where the doped semiconductor layer was selectively removed with a dielectric layer.

2. The method according to claim 1, wherein the selectively removing comprises selectively etching the doped semiconductor layer with respect to the undoped cap layer.

3. The method according to claim 2, wherein an etchant for performing the selective etching comprises $Cl_2$/HBr.

4. The method according to claim 2, further comprising recessing a portion of the bulk substrate to form an area through which an etchant for performing the selective etching can access the doped semiconductor layer.

5. The method according to claim 4, wherein the recessed portion comprises an isolation region of the bulk substrate.

6. The method according to claim 2, further comprising removing the dummy gates to form a plurality of openings through which an etchant for performing the selective etching can access the doped semiconductor layer.

7. The method according to claim 1, wherein the doped semiconductor layer comprises N+ doped silicon.

8. The method according to claim 1, wherein the undoped cap layer comprises silicon.

9. The method according to claim 1, wherein the undoped cap layer is thinner than the silicon layers of the stacked configuration.

10. The method according to claim 1, further comprising removing portions of the stacked configuration and underlying undoped cap and doped semiconductor layers to form a plurality of patterned stacks on corresponding undoped cap and doped semiconductor layers spaced apart from each other on the bulk substrate.

11. The method according to claim 1, wherein the doped semiconductor layer, the undoped cap layer and the SiGe and silicon layers of the stacked configuration are epitaxially grown.

12. The method according to claim 1, wherein the dielectric layer comprises a flowable dielectric.

13. A method for manufacturing a semiconductor device, comprising:
   forming a doped silicon layer on a bulk substrate;
   forming an undoped silicon cap layer on the doped silicon layer;
   forming a stacked configuration of silicon germanium (SiGe) and silicon layers on the undoped silicon cap layer, wherein the stacked configuration comprises a repeating arrangement of a silicon layer stacked on an SiGe layer;
   forming a plurality of dummy gates spaced apart from each other on the stacked configuration, the doped silicon layer and the undoped silicon cap layer;
   forming a spacer layer on each of the plurality of dummy gates, and on the doped silicon layer and the undoped silicon cap layer;
   selectively etching the doped silicon layer with respect to the undoped silicon layer; and
   filling the area from where the doped silicon layer was selectively removed with a dielectric layer.

14. The method according to claim 13, further comprising recessing a portion of the bulk substrate to form an area through which an etchant for performing the selective etching can access the doped silicon layer.

15. The method according to claim 13, further comprising removing the dummy gates to form a plurality of openings through which an etchant for performing the selective etching can access the doped silicon layer.

* * * * *